United States Patent
Jo et al.

(10) Patent No.: US 10,622,984 B2
(45) Date of Patent: Apr. 14, 2020

(54) RADIO FREQUENCY SWITCHING CIRCUIT AND APPARATUS WITH REDUCED SWITCHING RESPONSE DELAY

(71) Applicant: Samsung Electro-Mechanics Co., Ltd., Suwon-si (KR)

(72) Inventors: Byeong Hak Jo, Suwon-si (KR); Hyun Paek, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/117,794

(22) Filed: Aug. 30, 2018

(65) Prior Publication Data

US 2019/0229718 A1    Jul. 25, 2019

(30) Foreign Application Priority Data

Jan. 24, 2018 (KR) .................. 10-2018-0008697

(51) Int. Cl.
*H03K 17/0412* (2006.01)
*H03K 17/693* (2006.01)

(52) U.S. Cl.
CPC ..... *H03K 17/04123* (2013.01); *H03K 17/693* (2013.01)

(58) Field of Classification Search
CPC .. H03K 17/063; H03K 17/693; H03K 17/102; H03K 19/20; H03K 19/21

USPC ................. 327/374, 375, 376, 377
See application file for complete search history.

(56) References Cited

U.S. PATENT DOCUMENTS

| 7,613,442 | B1 | 11/2009 | Kelly et al. | |
|---|---|---|---|---|
| 7,746,123 | B2* | 6/2010 | Hester | H03K 17/6871 326/87 |
| 10,505,579 | B2* | 12/2019 | Jo | H03K 17/28 |
| 2015/0042399 | A1* | 2/2015 | Imbornone | G05F 1/461 327/537 |
| 2017/0363676 | A1* | 12/2017 | Shapiro | G01R 31/2621 |
| 2019/0310675 | A1* | 10/2019 | Araragi | H02M 7/53875 |

FOREIGN PATENT DOCUMENTS

WO    WO 87/03153 A1    5/1987

* cited by examiner

*Primary Examiner* — John W Poos
(74) *Attorney, Agent, or Firm* — NSIP Law (57) ABSTRACT

A radio frequency switching circuit includes a switching circuit comprising a plurality of switching transistors connected between a first terminal and a second terminal, a gate resistor circuit comprising a plurality of gate resistors, each of the plurality of gate resistors having a first node connected to a respective gate of each of the plurality of switching transistors, and a gate buffer circuit comprising a plurality of gate buffers, each of the plurality of gate buffers being connected to a respective second node of each of the plurality of gate resistors, wherein each of the plurality the gate buffers is configured to provide a first gate signal to the gate of each of the plurality of switching transistors through each of the plurality of gate resistors.

14 Claims, 9 Drawing Sheets

<EQUIVALENT CIRCUIT OF FIG. 3>

FIG. 6

<EQUIVALENT CIRCUIT OF FIG. 4>

RADIO FREQUENCY SWITCHING CIRCUIT AND APPARATUS WITH REDUCED SWITCHING RESPONSE DELAY

CROSS-REFERENCE TO RELATED APPLICATION

This application claims the benefit under 35 U.S.C. § 119(a) of Korean Patent Application No. 10-2018-0008697 filed on Jan. 24, 2018 in the Korean Intellectual Property Office, the entire disclosure of which is incorporated herein by reference for all purposes.

BACKGROUND

1. Field

This application relates to a radio frequency switching circuit and apparatus with switching response delay.

2. Description of Related Art

In general, a power amplifier module (PAM) that supports various frequency bands may include a radio frequency (RF) switch that selects a plurality of bands, a filter, and a plurality of power amplifiers (PAs) that amplify a RF signal.

The RF switch of the PAM may vary in terms of shape, depending on the configurations of the PA and the filter, and since the PA is typically designed in a wideband including a plurality of bands, a single pole multi-throw (SPMT) switch having one input port and a plurality of output ports may be used as the RF switch.

Typically, some bands (e.g., B42, B43, and B48) of the plurality of bands processed by the PAM may use a time division duplex (TDD) communications scheme, and since such a TDD communications scheme divides the time and alternately performs a transmission and a reception, a switching time may be important in operation performance in the above-mentioned TDD communications scheme.

The typical radio frequency switch may include a series switch and a shunt switch, and the series switch and the shunt switch may include a plurality of stacked transistors.

One terminal of a resistor is connected to a gate of each of the plurality of transistors, and the other terminal of the resistor is connected to a control buffer.

A switching delay time may be determined by a gate resistor connected to the gate of each of the plurality of transistors, and capacitors connected to the gate of each of the plurality of transistors, that is, a gate-source capacitor and a gate-drain capacitor of each of the plurality of transistors.

A size of the plurality of transistors may be determined by characteristics such as insertion loss of the switch, and the like, and when the size of the plurality of transistors is determined, a value of the capacitor is physically determined. As a result, when a standard of a switching time is determined, a resistance value is also determined according to the determined standard of the switching time.

Accordingly, the switching time and isolation characteristics are in a trade-off relationship with each other, and when the switching time is required to be shorter in any system, the isolation characteristics may be deteriorated.

Therefore, in the typical radio frequency switch, the switching time is increased when a resistance value of the gate resistor is maintained at a proper value in order not to deteriorate the isolation characteristics.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

In a general aspect, a radio frequency switching circuit includes a switching circuit comprising a plurality of switching transistors connected between a first terminal and a second terminal, a gate resistor circuit comprising a plurality of gate resistors, each of the plurality of gate resistors having a first node connected to a respective gate of each of the plurality of switching transistors, and a gate buffer circuit comprising a plurality of gate buffers, each of the plurality of gate buffers being connected to a respective second node of each of the plurality of gate resistors, wherein each of the plurality the gate buffers is configured to provide a first gate signal to the gate of each of the plurality of switching transistors through each of the plurality of gate resistors.

Each of the plurality of gate buffers may include a first buffer configured to receive the first gate signal, and a second buffer connected in parallel with the first buffer, and configured to receive the first gate signal.

Each of the plurality of gate resistors may include a first resistor connected to an output node of the first buffer, and a second resistor connected to an output node of the second buffer.

Each of the plurality of switching transistors may include a first transistor having a gate that is configured to receive the first gate signal from the first buffer, and a second transistor having a gate that is configured to receive the first gate signal from the second buffer, a source connected to a source of the first transistor, a gate connected to the gate of the first transistor, and a body connected to a body of the first transistor.

In a general aspect, a radio frequency switch apparatus includes a first radio frequency switching circuit connected between a first terminal and a second terminal and configured to switch a first signal path in response to a first signal, and a second radio switch circuit connected between the first terminal and a third terminal and configured to switch a second signal path in response to a second signal, wherein the first radio frequency switching circuit includes a switching circuit comprising a plurality of switching transistors connected between the first terminal and the second terminal, a gate resistor circuit comprising a plurality of gate resistors, each of the plurality of gate resistors having a first node connected to a respective gate of each of the plurality of switching transistors, and a gate buffer circuit comprising a plurality of gate buffers, each of the plurality of gate buffers connected to a respective second node of each of the plurality of gate resistors, wherein each of the plurality the gate buffers is configured to provide a first gate signal to the gate of each of the plurality of switching transistors through each of the plurality of gate resistors.

Each of the plurality of gate buffers may include a first buffer configured to receive the first gate signal, and a second buffer connected in parallel with the first buffer, and configured to receive the first gate signal.

Each of the plurality of gate resistors may include a first resistor connected to an output node of the first buffer, and a second resistor connected to an output node of the second buffer.

Each of the plurality of switching transistors may include a first transistor having a gate that is configured to receive the first gate signal from the first buffer, and a second transistor having a gate that is configured to receive the first gate signal from the second buffer, a source connected to a source of the first transistor, a gate connected to the gate of the first transistor, and a body connected to a body of the first transistor.

In a general aspect, a radio frequency switching circuit includes a switching circuit comprising a plurality of switching transistors connected in series, and a buffer circuit comprising a plurality of buffers, wherein each of the plurality of buffers is separately connected to a gate of each of the plurality of switching transistors, and wherein each of the plurality of buffers is configured to separately transmit a received gate signal to a respective gate of each of the plurality of switching transistors.

The radio frequency switching circuit may include a gate resistor circuit comprising a plurality of gate resistors, each of the plurality of gate resistors having a first node connected to a respective gate of each of the plurality of switching transistors, and a second node connected to a respective output of the plurality of buffers.

The buffers may be gate buffers.

Each of the switching transistors may include a first transistor and a second transistor connected in parallel to each other.

Each of the plurality of buffers may include a first buffer connected in parallel with a second buffer, and the first buffer and the second buffer are configured to receive the gate signal.

The plurality of switching transistors may be connected between a first terminal and a second terminal.

Other features and aspects will be apparent from the following detailed description, the drawings, and the claims.

Throughout the drawings and the detailed description, the same reference numerals refer to the same elements. The drawings may not be to scale, and the relative size, proportions, and depiction of elements in the drawings may be exaggerated for clarity, illustration, and convenience. In the drawings, for example, due to manufacturing techniques and/or tolerances, modifications of the shape shown may be estimated. Thus, the examples described herein should not be construed as being limited to the particular shapes of regions shown herein, for example, the examples described herein include a change in shape as a result of manufacturing.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 1:
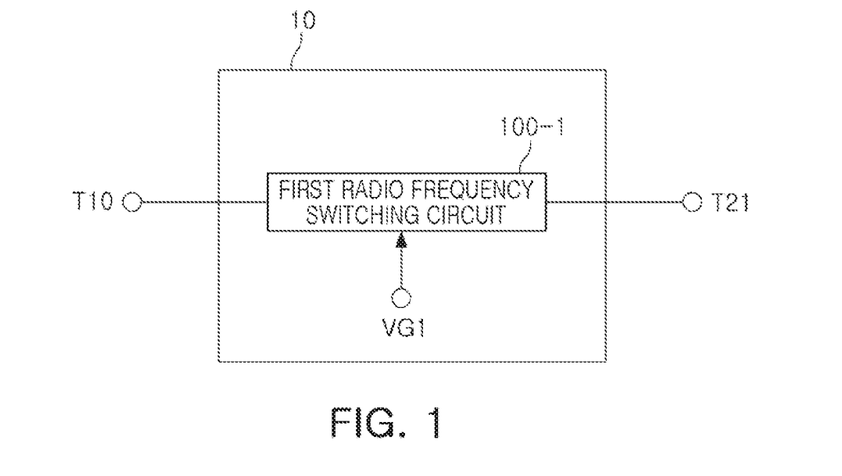
FIG. 1 is an illustrative view of an example of a radio frequency (RF) switch apparatus.

FIG. 1 is an illustrative view of an example of a radio frequency (RF) switch apparatus.

Referring to FIG. 1, the RF switch apparatus may include a switch circuit 10.

The switch circuit 10 may include at least a first radio frequency switching circuit 100-1.

The first radio frequency switching circuit 100-1 may be connected between a first terminal T10 and a second terminal T21 and is operable to switch a first signal path between the first terminal T10 and the second terminal T21 in response to a first gate signal VG1.

Figure 2:
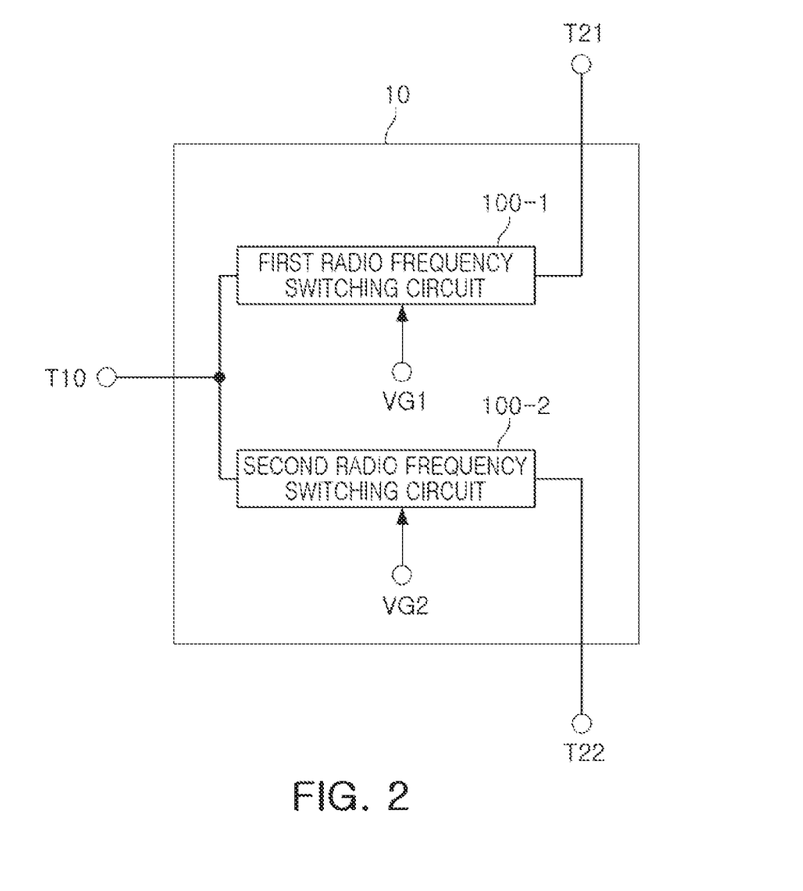
FIG. 2 is an illustrative view of an example of a radio frequency switch apparatus.

FIG. 2 is another illustrative view of an example of the RF switch apparatus.

Referring to FIG. 2, the switch 10 of the RF switch apparatus may include at least the first radio frequency switching circuit 100-1 and a second frequency switch circuit 100-2.

The first radio frequency switching circuit 100-1 may be connected between a first terminal T10 and a second terminal T21, and is operable to switch a first signal path between the first terminal T10 and the second terminal T21 in response to a first gate signal VG1.

The second radio frequency switching circuit 100-2 may be connected between the first terminal T10 and a third terminal T22, and is operable to switch a second signal path between the first terminal T10 and the third terminal T22 in response to a second gate signal VG2.

Figure 3:
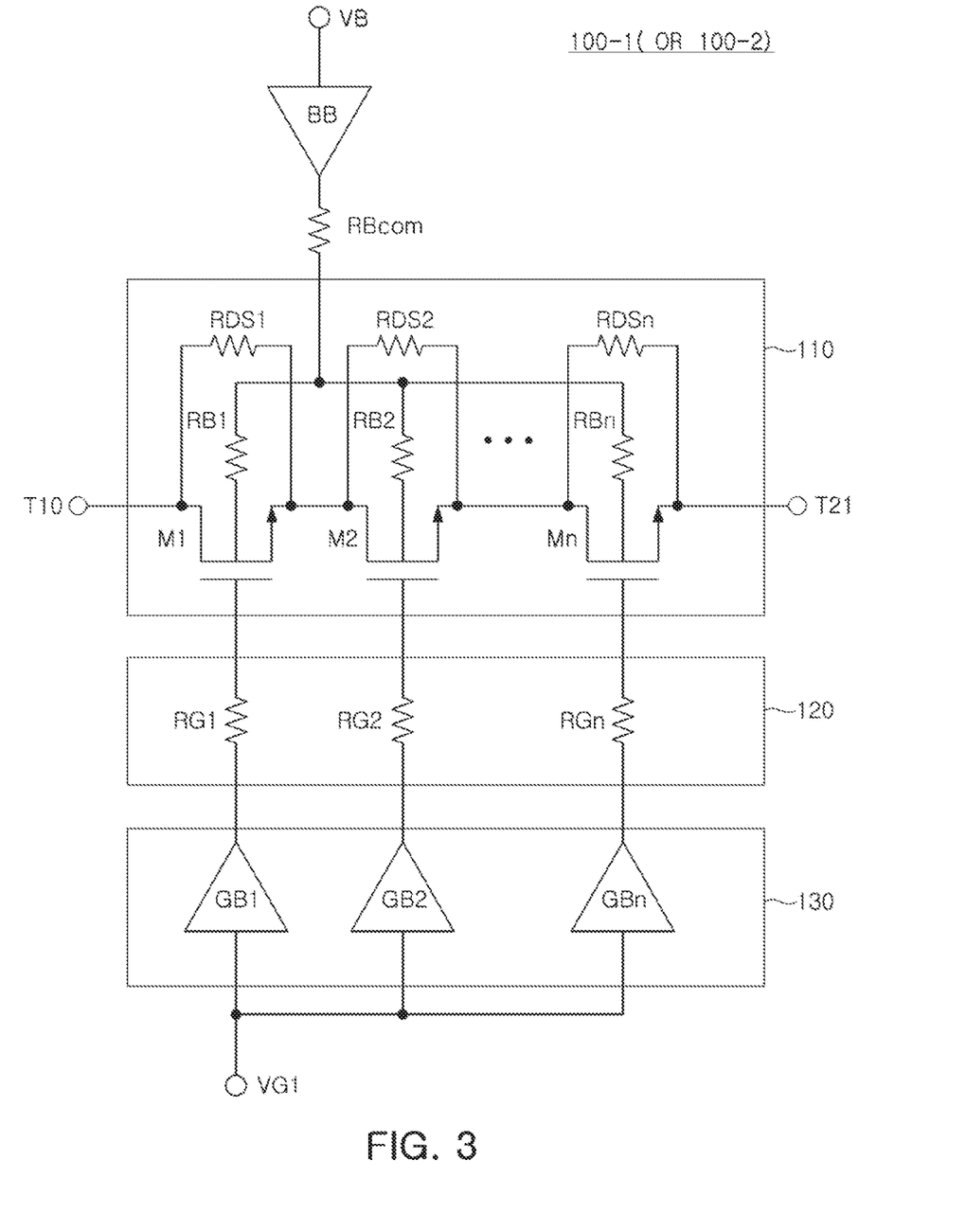
FIG. 3 is an illustrative view of an example of a radio frequency switching circuit.

Referring to FIGS. 1 and 2, the first radio frequency switching circuit 100-1 and the second radio frequency switching circuit 100-2 may have the same circuit structure as each other. However, this is only an example, and the first radio frequency switching circuit 100-1 and the second radio frequency switching circuit 100-2 may have different circuit structures. The first radio frequency switching circuit 100-1 and the second radio frequency switching circuit 100-2 may have a circuit structure as illustrated in FIG. 3. As an example, the first radio frequency switching circuit 100-1 will be described.

FIG. 3 is an illustrative view of an example of a radio frequency switching circuit.

Referring to FIG. 3, the first radio frequency switching circuit 100-1 may include a switching circuit 110, a gate resistor circuit 120, and a gate buffer circuit 130.

The switching circuit 110 may include first to n-th switching transistors M1 to Mn connected between the first terminal T10 and the second terminal T21.

The gate resistor circuit 120 may include first to n-th gate resistors RG1 to RGn having one terminal or node connected to a gate of each of the first to n-th switching transistors M1 to Mn. As an example, each of the first to n-th gate resistors RG1 to RGn, which is an isolation resistor, may have a relatively large resistance value (e.g., 50 KΩ) to form a separated state in an alternating current (AC) state and a connected state in a direct current (DC) state.

The gate buffer circuit 130 may include first to n-th gate buffers GB1 to GBn. The first to n-th gate buffers GB1 to GBn may be connected to the other terminal or node of each of the first to n-th gate resistors RG1 to RGn and provide a first gate signal VG1 to gates of the first to n-th switching transistors M1 to Mn through the first to n-th gate resistors RG1 to RGn.

As an example, the first gate signal VG1 may be supplied to the gate of the first switching transistor M1 through the first gate buffer GB1 and the first gate resistor RG1, and the first gate signal VG1 may also be supplied to the gate of the n-th switching transistor Mn through the n-th gate buffer GBn and the n-th gate resistor RGn.

In FIG. 3, resistors RDS1, and RDS2 to RDSn are drain-source resistors of the first to n-th switching transistors M1 to Mn and are resistors for distributing a DC voltage, which is a reference voltage, to drains and sources of the first to n-th switching transistors M1 to Mn. Resistors RB1 and RB2 to RBn are separate body resistors of the first to n-th switching transistors M1 to Mn, and RBcom is a common body resistor of the first to n-th switching transistors M1 to Mn. BB may be a body buffer and VB may be a body voltage.

Figure 4:
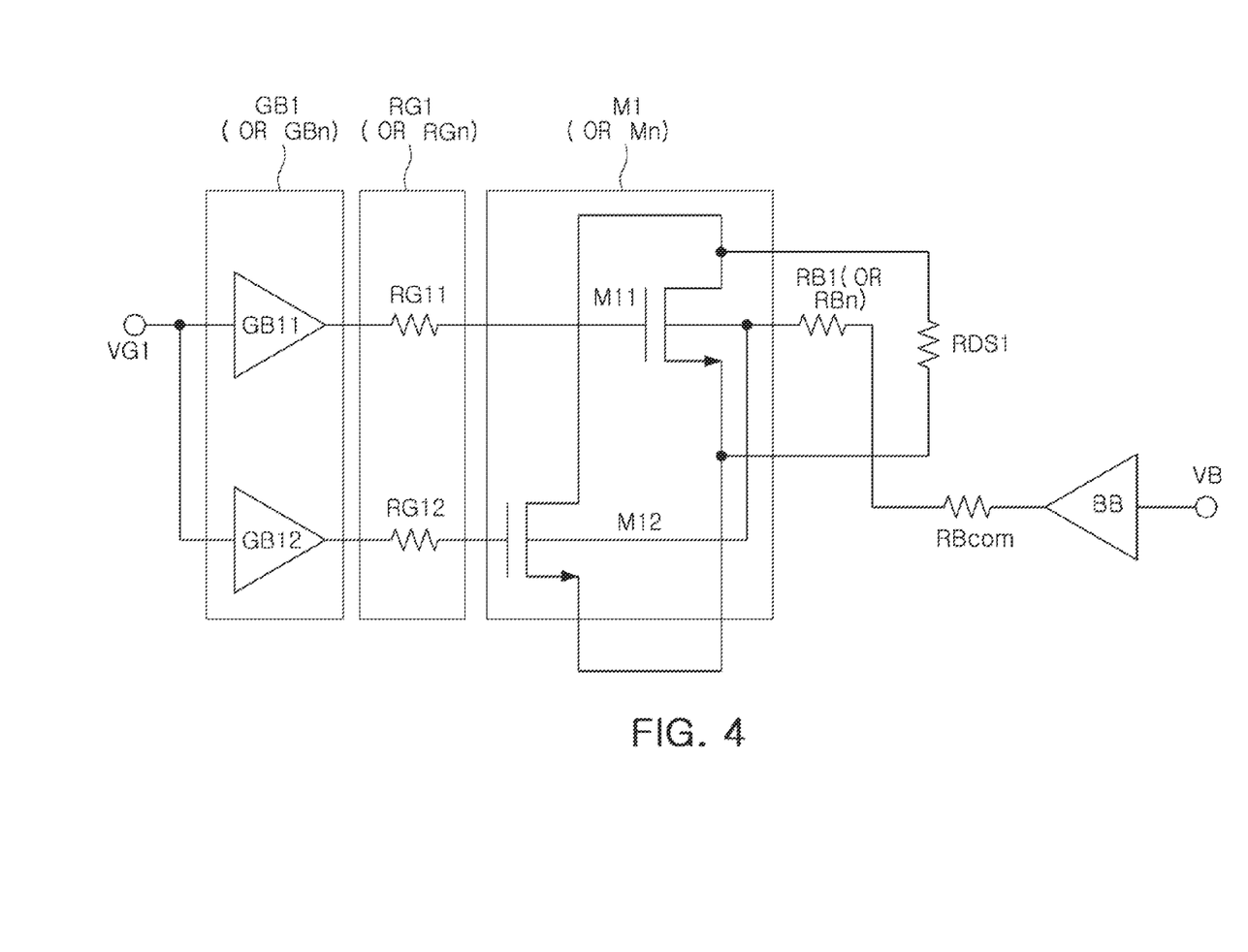
FIG. 4 is an illustrative view of an example of a first gate buffer, a first gate resistor, and a first transistor of the radio frequency switching circuit of FIG. 3.

FIG. 4 is an illustrative view of an example of a first gate buffer GB1, a first gate resistor GR1, and a first switching transistor M1 of the radio frequency switching circuit of FIG. 3.

Referring to FIG. 4, the first or n-th gate buffer GB1 or GBn may include a first buffer GB11 and a second buffer GB12.

The first buffer GB11 and the second buffer GB12 may be connected in parallel to each other, and each of the first buffer GB11 and the second buffer GB12 may be provided with the first gate signal VG1. As an example, a size of each of the first buffer GB11 and the second buffer GB12 may be smaller than a size of the first gate buffer GB1 of FIG. 3 and may be, for example, a half of the size of the first gate buffer GB1.

The first or n-th gate resistor RG1 or RGn may include a first resistor RG11 and a second resistor RG12.

The first resistor RG11 may be connected to an output terminal or node of the first buffer GB11 and transmit the first gate signal VG1 output from the first buffer GB11 to the gate of the first switching transistor M1.

The second resistor RG12 may be connected to an output terminal or node of the second buffer GB12 and transmit the first gate signal VG1 output from the second buffer GB12 to the gate of the first switching transistor M1.

The first or n-th switching transistor M1 or Mn may include a first transistor M11 and a second transistor M12.

The first transistor M11 may include a gate to which the first gate signal VG1 is input from the first buffer GB11. As an example, a size of each of the first transistor M11 and the second transistor M12 may be smaller than a size of the first switching transistor M1 of FIG. 3 and may be, for example, a half of the size of the first switching transistor M1.

The second transistor M12 may include a gate to which the first gate signal VG1 is input from the second buffer GB12, a source connected to a source of the first transistor M11, a gate connected to the gate of the first transistor M11, and a body connected to a body of the first transistor M11.

As an example, the bodies of the first transistor M11 and the second transistor M12 may be connected to each other and connected to a body buffer BB through a separate body resistor RB1 or RBn and a common body resistor RBcom, and in this case, a body voltage VB may pass through the body buffer BB, the common body resistor RBcom, and the separate body resistor RB1 or RBn, and may be then supplied to the bodies of the first transistor M11 and the second transistor M12.

Referring to FIG. 3, a switching speed of the radio frequency switching circuit may be dependent on a time constant T determined according to a resistance value R of the first or n-th gate resistor RG1 or RGn and capacitance C of the first or n-th switching transistor M1 or Mn.

Since the first or n-th gate resistor RG1 or RGn is the isolation resistor, the first or n-th gate resistor RG1 or RGn may be set to a relatively large resistance value R.

In addition, when compared to the typical structure in which one buffer is used, in the radio frequency switching circuit according to the example, the buffer may be disposed in each of the first or n-th switching transistor M1 or Mn. As a result, when being viewed from each of the first or n-th switching transistor M1 or Mn, since only one gate resistor and one switching transistor are viewed, the magnitude of the gate signal may be reduced and the size of the buffer may be thus reduced.

Therefore, the switching speed may be improved without increasing an overall size of the radio frequency switching circuit. As described above, in a case in which the radio frequency switching circuit has the circuit structure as illustrated in FIG. 3, a switching time may be improved without deteriorating isolation characteristic and increasing a size or an area of the radio frequency switching circuit.

Further, in order to obtain a relatively faster switching time, the switch may be configured as illustrated in FIG. 4.

In addition, referring to FIG. 4, one switching transistor of FIG. 3 may be divided into two first and second transistors (FETs) M11 and M12, which may be connected in parallel to each other. In this case, sources, drains, and bodies of the first and second transistors (FETs) M11 and M12 may be commonly connected to each other, and only gates thereof may be driven with different buffers. As an example, a value of the resistor connected to the gate may have the same value as that of the typical structure, such that sufficient isolation may be secured, and gate capacitance is reduced to a half, such that the switching time may be reduced.

Figure 5:
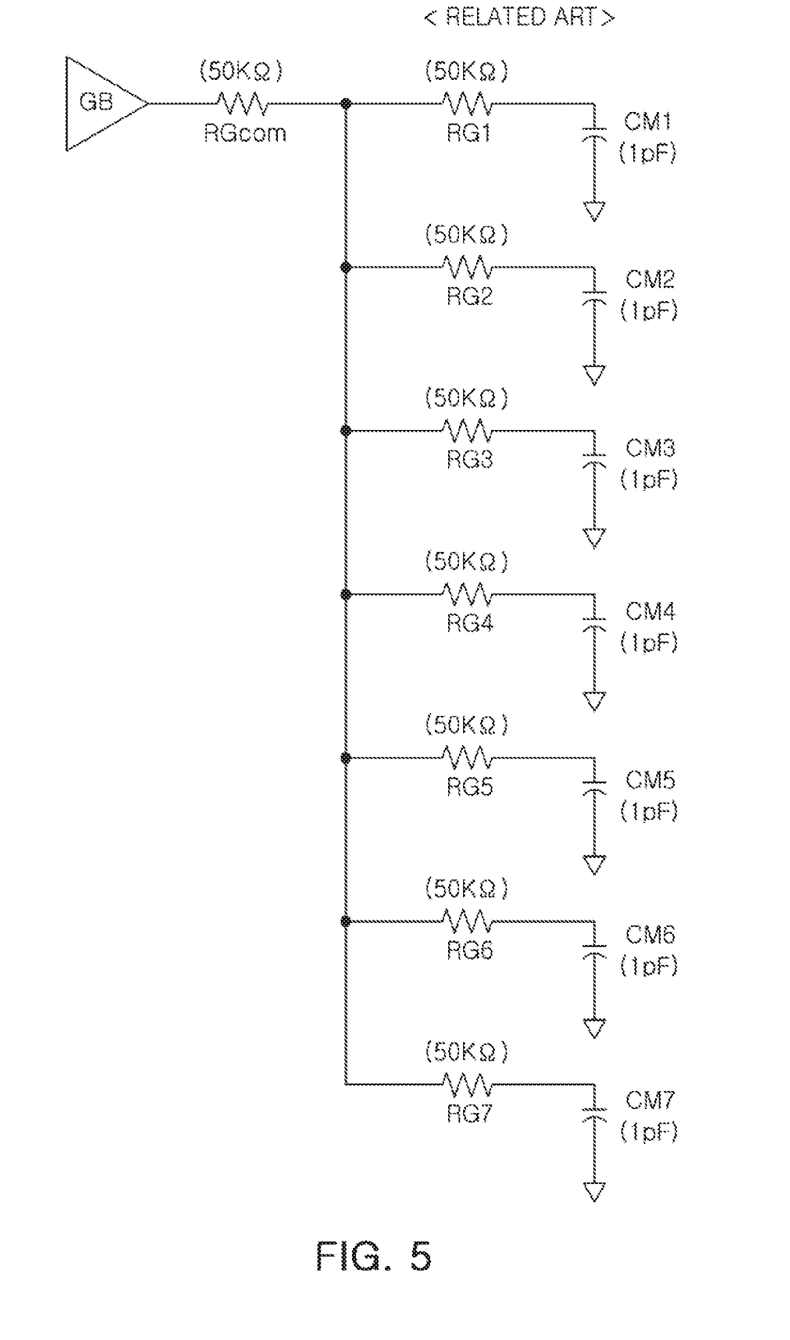
FIG. 5 is an example of an equivalent circuit diagram of a resistor and a capacitor of the typical radio frequency switching circuit.

FIG. 5 is an example of an equivalent circuit diagram of a resistor and a capacitor of the conventional radio frequency switching circuit.

A case in which the typical radio frequency switching circuit includes one gate buffer GB, a common gate resistor RGcom, separate gate resistors RG1 to RG7, and capacitances CM1 to CM7 of first to seventh switching transistors will be described with reference to FIG. 5.

When viewing each of the first to seventh switching transistors M1 to M7 of the switching circuit 100 from the gate buffer GB, the common gate resistor RGcom, the separate gate resistors RG1 to RG7, and the capacitances CM1 to CM7 of each of the first to seventh switching transistors may be viewed as illustrated in FIG. 5.

Figure 6:
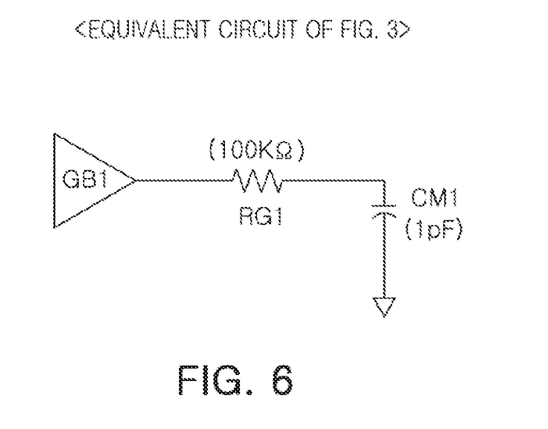
FIG. 6 is an example of an equivalent circuit diagram of a resistor and a capacitor of the radio frequency switching circuit of FIG. 3.

FIG. 6 is an example of an equivalent circuit diagram of a resistor and a capacitor of the radio frequency switching circuit of FIG. 3.

A case in which the radio frequency switching circuit of FIG. 3 includes first to n-th gate buffers GB1 to GBn, first to n-th gate resistors RG1 to RGn, and the first to n-th switching transistors M1 to Mn will be described with reference to FIGS. 3 and 6.

When viewing the first switching transistor M1 of the switching circuit 110 from the first gate buffer GB1, the first gate resistor RG1 and capacitance CM1 of the first switching transistor M1 may be viewed as illustrated in FIG. 6.

Figure 7:
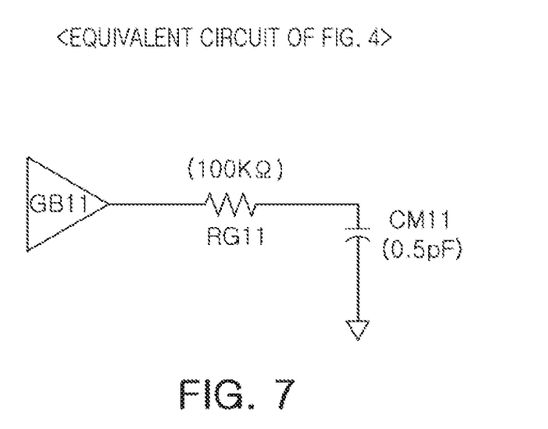
FIG. 7 is an example of an equivalent circuit diagram of a resistor and a capacitor of the radio frequency switching circuit of FIG. 4.

FIG. 7 is an example of an equivalent circuit diagram of a resistor and a capacitor of the radio frequency switching circuit of FIG. 4.

A case in which each of the first to n-th gate buffers GB1 to GBn includes first and second buffers GB11 and GB12, each of the first to n-th gate resistors RG1 to RGn includes a first resistor RG11 and a second resistor RG12, and each of the first to n-th switching transistors M1 to Mn includes a first transistor M11 and a second transistor M12 in the radio frequency switching circuit of FIG. 4 will be described with reference to FIGS. 4 and 7.

When viewing the first transistor M11 of the switching circuit 110 from the first buffer GB11, the first resistor RG11 and capacitance CM11 of the first transistor M11 may be viewed as illustrated in FIG. 7.

Figure 8:
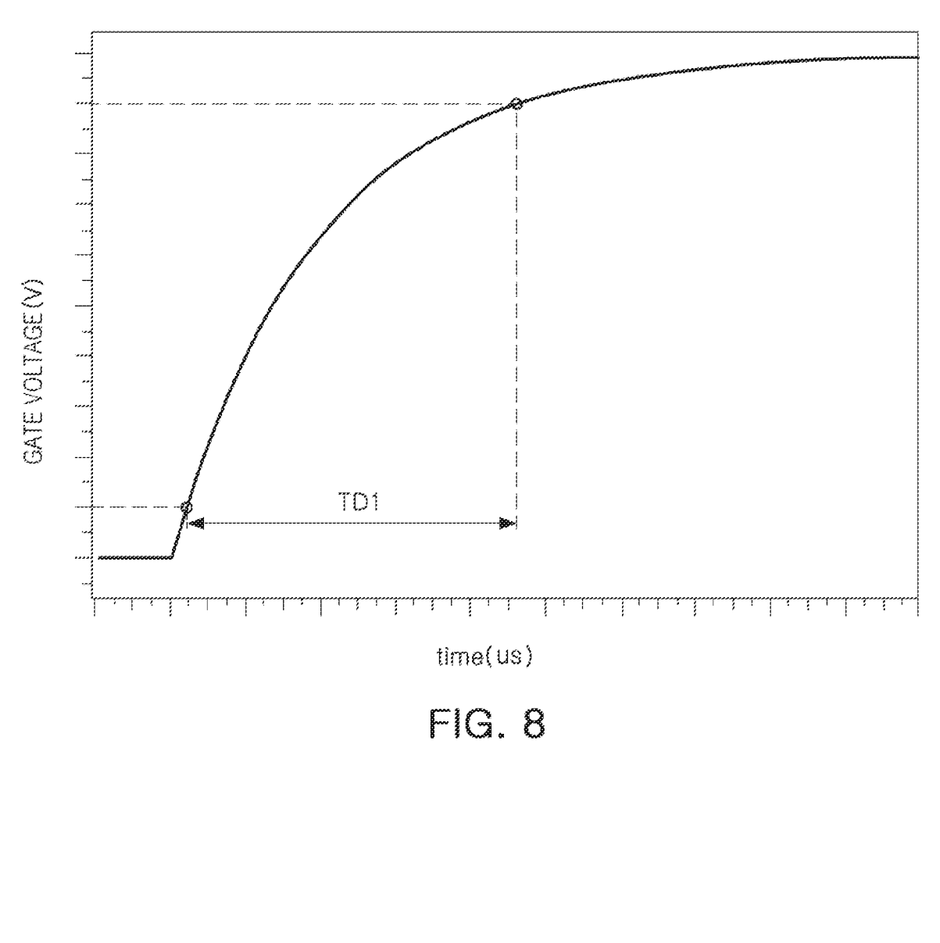
FIG. 8 is a view illustrating an example of a response characteristic for each gate signal of FIG. 5.

FIG. 8 is a view illustrating an example of a response characteristic for each gate signal of FIG. 5.

Referring to FIGS. 5 and 8, as an example, in a case in which the common gate resistor RGcom has a resistance value of 50 KΩ, each of the separate gate resistors RG1 to RG7 has the resistance value of 50 KΩ, and the capacitances CM1 to CM7 of each of the first to seventh switching transistors M1 to M7 have a value of 1 pF, when the gate signal is supplied to the gate of each of the first to seventh switching transistors M1 to M7 through the gate buffer GB, the common gate resistor RGcom, and the separate gate resistors RG1 to RG7, a switching response delay time TD1 (or a rising time) for the gate signal may be calculated as in Equation 1 below.

$$TD1 \approx RT^*CT^*\tau \approx 57\ K\Omega^*7\ pF \approx 390\ nsec \qquad \text{Equation 1}$$

In Equation 1, RT, which is an overall resistance value of seven gate resistors connected in parallel to each other, may be approximately 57 KΩ, and CT, which is an overall value of the capacitances of the transistors connected in parallel to each other, may be approximately 7 pF.

Figure 9:
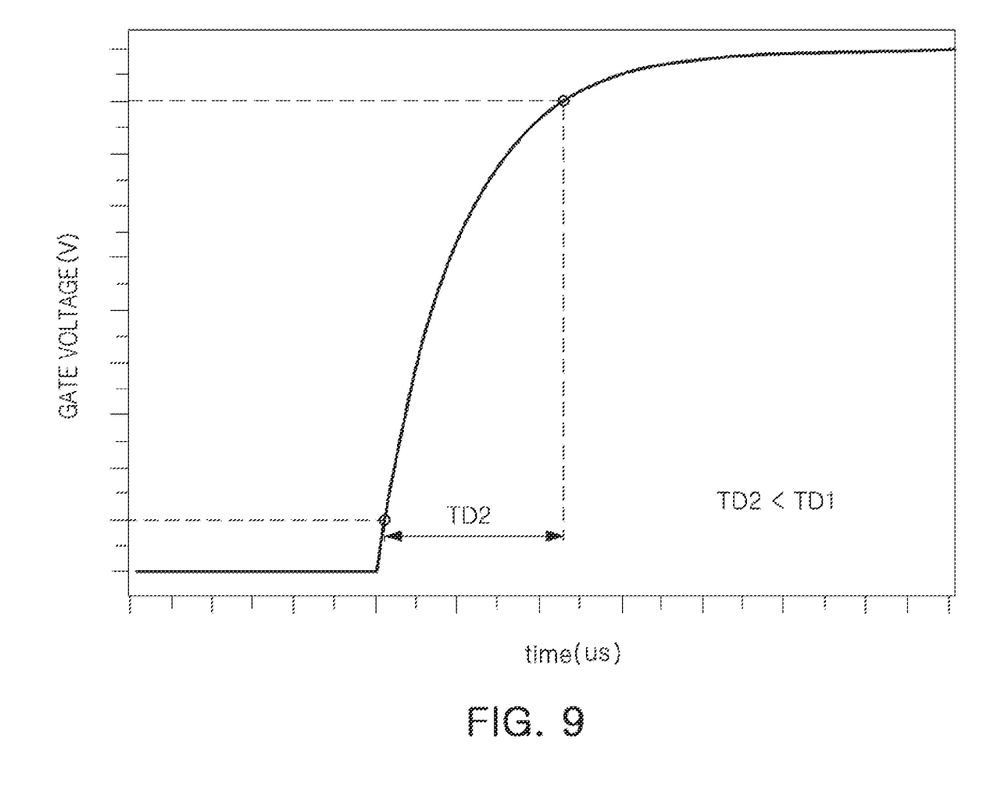
FIG. 9 is a view illustrating an example of a response characteristic for each gate signal of FIG. 6.

FIG. 9 is a view illustrating an example of a response characteristic for each gate signal of FIG. 6.

Referring to FIGS. 6 and 9, as an example, in a case in which the first gate resistor RG1 has a resistance value of 100 KΩ and the capacitance CM1 of the first switching transistor M1 has a value of 1 pF, when the first gate signal VG1 is supplied to the gate of the first switching transistor M1 through the first gate buffer GB1 and the first gate resistor RG1, a switching response delay signal TD2 (or a rising time) for the first gate signal may be calculated as in Equation 2 below.

$$TD2 \approx RT^*CT^*\tau \approx 100\ K\Omega^*1\ pF \approx 100\ nsec \qquad \text{Equation 2}$$

In Equation 2, RT, which is the resistance value of the first gate resistor, may be approximately 100 KΩ, and CT, which is the value of the capacitance of the first switching transistor, is about 1 pF.

Figure 10:
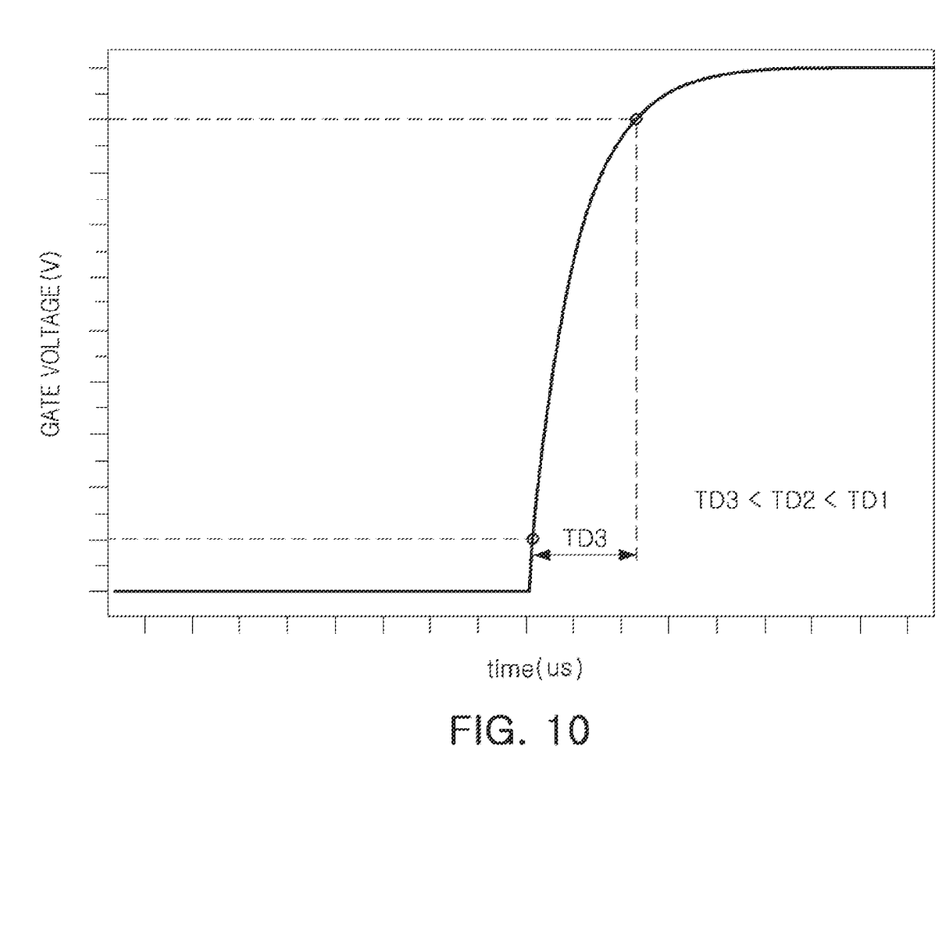
FIG. 10 is a view illustrating an example of a response characteristic for each gate signal of FIG. 7.

FIG. 10 is a view illustrating an example of a response characteristic for each gate signal of FIG. 7.

Referring to FIGS. 7 and 10, as an example, in a case in which the first resistor RG11 has a resistance value of 100 KΩ and the capacitance CM11 of the first transistor M11 has a value of 1 pF, when the first gate signal VG1 is supplied to the gate of the first transistor M11 through the first buffer GB11 and the first resistor RG11, a switching response delay signal TD3 (or a rising time) for the first gate signal may be calculated as in Equation 3 below.

$$TD3 \approx RT*CT*\tau \approx 100\ K\Omega*0.5\ pF \approx 100\ nsec \quad \text{Equation 3}$$

In Equation 3, RT, which is the resistance value of the first resistor, may be 100 KΩ, and since a size of the first transistor is a half of a size of the conventional transistor, CT, which is the capacitance of the first transistor, is 0.5 pF.

Figure 11:
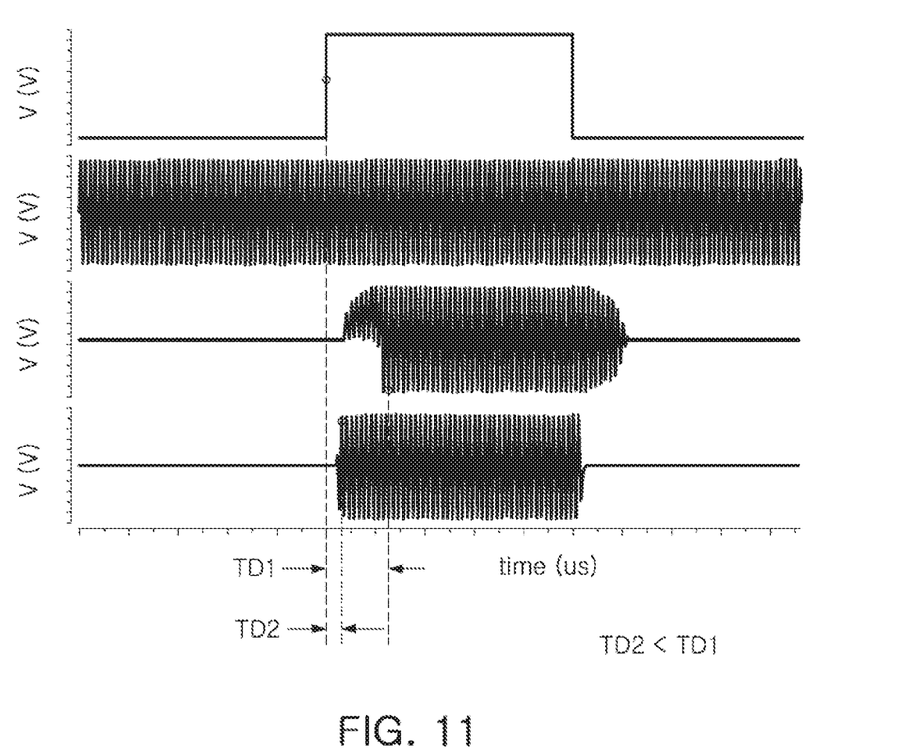
FIG. 11 is a view illustrating an example of a delay time of a gate signal.

FIG. 11 is a view illustrating an example of a delay time of a gate signal.

In FIG. 11, TD1 is a delay time of a gate signal of the typical radio frequency switching circuit and TD2 is a delay time of a gate signal of a radio frequency switching circuit of the current example.

Comparing TD1 and TD2 of FIG. 11 with each other, it may be seen that the delay time TD2 of the gate signal of the radio frequency switching circuit according to the example is shorter than the delay time TD1 of the gate signal of the typical radio frequency switching circuit, thereby reducing a switching delay.

As set forth above, according to an example, a switching response delay time may be reduced without deteriorating isolation characteristic by including a separate buffer for each of the switching transistors, thereby enabling a high-speed switching, and a switching speed may be improved by implementing a structure in which two transistors having a small size are connected in parallel to each other instead of the typical switching transistors.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switching circuit comprising:
a switching circuit comprising a plurality of switching transistors connected between a first terminal and a second terminal, each of the plurality of switching transistors comprising at least a first transistor and a second transistor connected in parallel to each other;
a gate resistor circuit comprising a plurality of gate resistors, each of the plurality of gate resistors having a first node connected to a respective gate of each of the plurality of switching transistors; and
a gate buffer circuit comprising a plurality of gate buffers, each of the plurality of gate buffers being connected to a respective second node of each of the plurality of gate resistors,
wherein each of the plurality the gate buffers is configured to provide a first gate signal to the gate of each of the plurality of switching transistors through each of the plurality of gate resistors, and
wherein a source of each of the first transistors is connected to a source of each of the second transistors, and a body of each of the first transistors is connected to a body of each of the second transistors.

2. The radio frequency switching circuit of claim 1, wherein each of the plurality of gate buffers comprises:
a first buffer configured to receive the first gate signal; and
a second buffer connected in parallel with the first buffer, and configured to receive the first gate signal.

3. The radio frequency switching circuit of claim 2, wherein each of the plurality of gate resistors comprises:
a first resistor connected to an output node of the first buffer; and
a second resistor connected to an output node of the second buffer.

4. The radio frequency switching circuit of claim 3, wherein:
each of the first transistors comprise a gate that is configured to receive the first gate signal from the first buffer; and
each of the second transistors comprise a gate that is configured to receive the first gate signal from the second buffer,
wherein the gate of each of the second transistors is connected to the gate of each of the first transistors.

5. A radio frequency switch apparatus comprising:
a first radio frequency switching circuit connected between a first terminal and a second terminal and configured to switch a first signal path in response to a first signal; and
a second radio switch circuit connected between the first terminal and a third terminal and configured to switch a second signal path in response to a second signal,
wherein the first radio frequency switching circuit comprises:
a switching circuit comprising a plurality of switching transistors connected between the first terminal and the second terminal, each of the plurality of switching transistors comprising at least a first transistor and a second transistor connected in parallel to each other;
a gate resistor circuit comprising a plurality of gate resistors, each of the plurality of gate resistors having a first node connected to a respective gate of each of the plurality of switching transistors; and
a gate buffer circuit comprising a plurality of gate buffers, each of the plurality of gate buffers connected to a respective second node of each of the plurality of gate resistors,
wherein each of the plurality the gate buffers is configured to provide a first gate signal to the gate of each of the plurality of switching transistors through each of the plurality of gate resistors, and
wherein a source of each of the first transistors is connected to a source of each of the second transistors, and a body of each of the first transistors is connected to a body of each of the second transistors.

6. The radio frequency switch apparatus of claim 5, wherein each of the plurality of gate buffers comprises:
a first buffer configured to receive the first gate signal; and
a second buffer connected in parallel with the first buffer, and configured to receive the first gate signal.

7. The radio frequency switch apparatus of claim 6, wherein each of the plurality of gate resistors comprises:
a first resistor connected to an output node of the first buffer; and
a second resistor connected to an output node of the second buffer.

8. The radio frequency switch apparatus of claim 7, wherein:
   each of the first transistors comprise a gate that is configured to receive the first gate signal from the first buffer; and
   each of the second transistors comprise a gate that is configured to receive the first gate signal from the second buffer,
   wherein the gate of each of the second transistors is connected to the gate of each of the first transistors.

9. A radio frequency switching circuit comprising:
   a switching circuit comprising a plurality of switching transistors connected in series, each of the plurality of switching transistors comprising at least a first transistor and a second transistor connected in parallel to each other; and
   a buffer circuit comprising a plurality of buffers;
   wherein each of the plurality of buffers is separately connected to a gate of each of the plurality of switching transistors, and
   wherein each of the plurality of buffers is configured to separately transmit a received gate signal to a respective gate of each of the plurality of switching transistors, and
   wherein a source of each of the first transistors is connected to a source of each of the second transistors, and a body of each of the first transistors is connected to a body of each of the second transistors.

10. The radio frequency switching circuit of claim 9, further comprising a gate resistor circuit comprising a plurality of gate resistors, each of the plurality of gate resistors having a first node connected to a respective gate of each of the plurality of switching transistors, and a second node connected to a respective output of the plurality of buffers.

11. The radio frequency switching circuit of claim 10, wherein the buffers are gate buffers.

12. The radio frequency switching circuit of claim 9, wherein each of the plurality of buffers comprises a first buffer connected in parallel with a second buffer, and
   the first buffer and the second buffer are configured to receive the gate signal.

13. The radio frequency switching circuit of claim 9, wherein the plurality of switching transistors are connected between a first terminal and a second terminal.

14. A radio frequency switching circuit comprising:
   a switching circuit comprising a switching transistor, the switching transistor comprising a first transistor connected in parallel with a second transistor;
   a gate resistor circuit comprising a first gate resistor having a first node connected to a gate of the first transistor, and a second gate resistor having a first node connected to a gate of the second transistor; and
   a buffer circuit comprising a first buffer connected to a second node of the first gate resistor, and a second buffer connected to a second node of the second gate resistor;
   wherein each of the first buffer and the second buffer is configured to separately transmit a received gate signal to a respective gate of the first transistor and the second transistor, and
   wherein a source of the first transistor is connected to a source of the second transistor, and a body of the first transistor is connected to a body of the second transistor.

* * * * *